United States Patent [19]

Gudaitis

[11] Patent Number: 4,686,391
[45] Date of Patent: Aug. 11, 1987

[54] FAST-ACTING COMPARISON CIRCUIT
[75] Inventor: Algird M. Gudaitis, Stow, Mass.
[73] Assignee: GenRad, Inc., Concord, Mass.
[21] Appl. No.: 860,819
[22] Filed: May 8, 1986
[51] Int. Cl.[4] .............................................. H03K 5/153
[52] U.S. Cl. ...................................... 307/354; 307/362
[58] Field of Search ............... 307/352, 354, 360, 356, 307/362

[56] References Cited

U.S. PATENT DOCUMENTS 4,282,489 8/1981 DeRienzo ........................... 307/354
4,500,841 2/1985 Morey .................................. 307/362

OTHER PUBLICATIONS

R. G. Beistle et al., "Voltage Comparator with Adjustable Trip Point and Hysteresis", IBM Technical Disclosure Bulletin, vol. 18, No. 11, Apr., 1976, p. 3574.

Primary Examiner—John Zazworsky
Attorney, Agent, or Firm—Cesari and McKenna

[57] ABSTRACT

An error-detection circuit (10) employs comparison circuitry (12) to determine whether a SENSE signal is within a range indicated by XPRANGE signals. When the SENSE signal goes into or out of the indicated range, an INRANGE output of the comparison circuitry (12) moves through a predetermined voltage swing from one stable level through a threshold level to another stable level. The passage of the INRANGE signal through the threshold level is an indication to subsequent circuitry that SENSE has passed into or out of the indicated range. According to the present invention, one or other of the levels occupied by the INRANGE signal is separated from the threshold by a voltage that is only a small fraction of the swing between the two levels. As a consequence, the delay between the transition of the SENSE signal and the transition of the INRANGE output of the comparison circuitry is only a small fraction of the time required to complete the voltage swing. Systems, such as automatic testers, that employ a large number of such comparison circuits can therefore employ components that are slower and thus cost less than the component would be required in conventional circuits having the same speed.

6 Claims, 6 Drawing Figures

FAST-ACTING COMPARISON CIRCUIT

BACKGROUND OF THE INVENTION

The present invention is directed to logic-level sensors, particularly sensors to be used in testing very fast digital circuitry.

A large number of the procedures employed in automatic test equipment for testing digital circuitry involve determining that a signal has reached one of two discrete logic levels by a predetermined time. The sensor for making the determination typically includes a comparator, which receives a reference level as one input and as its other input a signal from the circuit to be tested. The output of the comparator assumes a first level when the sensed voltage is greater than the reference voltage signal and assumes a second level when the sensed voltage is less than the reference voltage. The automatic test equipment inspects the comparator output at a predetermined time to determine whether the output of the circuit under test is at the right logic level.

In high-speed circuitry, the requirements are such that the time taken by the comparator for a transition of its output from one of its levels to the other is significant. The circuit under test may be required to reach a predetermined level at a certain time, but inspection of the comparator output must be delayed from that time because the comparator must be given time to change its output in response to the change in the output of the circuit under test. Accordingly, the tester must take the comparator delay into account and inspect the comparator output at a time delayed from the required transition time by the expected delay of the comparator.

For this reason, comparators used for this purpose are typically high-speed devices The high speed is desired for two reasons. One is that a shorter comparator delay results in a faster overall test. The second is that a faster comparator minimizes inaccuracies; the speed of a comparator transition depends to a certain extent on the amount by which the sensed signal differs from the reference signal, so the delay imposed by the comparator can vary. A faster comparator reduces the amount of variation caused by variations in input signal.

This requirement for fast comparators can result in significant increases in the cost of automatic test equipment. It is not uncommon for automatic test equipment to have two to three hundred test pins, and at least two comparators are typically required for each test pin. Thus, the comparator expense makes a significant contribution to the expense of the entire system.

It is accordingly an object of the present invention to achieve low, repeatable comparison times without using the high-cost comparators that such high-speed comparisons would ordinarily require.

SUMMARY OF THE INVENTION

Like previous arrangements, the present invention employs a comparator for comparing the input to a reference level. It also includes means for sampling the output of the comparator at a predetermined time. As is conventional, the comparator output is ordinarily at one or the other of only two predetermined voltage levels, one predetermined level indicating that the input is higher than the reference level, the other predetermined level indicating that the input is lower. Unlike other systems, however, the system of the present invention interprets the comparator output as having the meaning represented by one of the predetermined levels whenever the comparator output differs from the other predetermined level by more than a relatively small fraction of the difference between the nominal levels, e.g., 25% or less, rather than the approximately 50% that is conventional. This arrangement allows an otherwise relatively slow comparator to be treated as a faster comparator. If the output threshold of the comparator is very near the lower level, for example, and if the high output level indicates that the input has reached an expected level, then the output of the comparator can be sampled very shortly after the comparator output begins its movement from its low level to its high level.

BRIEF DESCRIPTION OF THE DRAWINGS

These and further features and advantages of the present invention are described in connection with the accompanying drawings, in which.

DETAILED DESCRIPTION OF THE PREFERRED EMBODIMENTS

Figure 1:
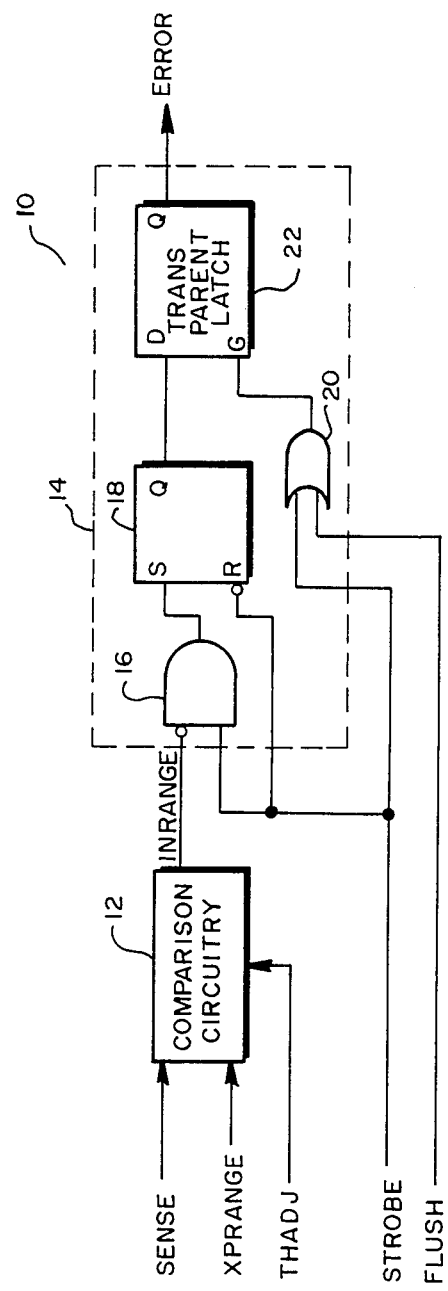
FIG. 1 is a block diagram of a detection circuit employing the teachings of the present invention.

FIG. 1 depicts an error detector 10 for a digital-circuit tester employing the teachings of the present invention. A SENSE signal is the buffered signal from a test node in the unit under test. An XPRANGE signal indicates the range of the signal that will be considered correct, and any signal outside of this range at the intended time is in error.

In the illustrated embodiment, there are three possible expected outputs: high, low, and tri-state. If the expected value of the signal is high, the range includes all voltage values above a high reference level. If the expected value is low, a correct value is any voltage below a lower reference level. If the expected output is a high-impedance state, the tester will have loaded the test node to cause it to assume an intermediate voltage value when it is in its high-impedance state (tri-state), and the node signal will be considered to be valid if it is between the high and low reference levels.

The error detector 10 determines whether the expected level has been present during a predetermined time interval. The time during which the expected level must be present is defined by a STROBE signal, which is at, say, a high level during a time period representing the time at which the expected level is to be present. The STROBE signal is typically delayed slightly from the actual time at which the expected signal is required to be present so as to allow for various delays in the detector circuitry. If the expected level is present throughout the time indicated by the strobe signal, then the ERROR output of the circuit 10 is low, indicating that the output is not in error. If the SENSE signal is outside the expected range during any portion of the time interval indicated by the STROBE signal, then the ERROR signal assumes a high level to indicate that an error has been detected, and it remains at that high level until other circuitry, not shown, has read the ERROR signal and sent a FLUSH signal to return the ERROR signal to its low level.

To carry out these functions, comparison circuitry 12 generates an INRANGE signal that has a high value during those times when the SENSE signal is within the range indicated by the XPRANGE signals. The comparison circuitry 12 sends the INRANGE signal to sampling circuitry 14 which serves as an error indicator. Sampling circuitry 14 is depicted for explanatory purposes as including an AND gate 16 that receives the INRANGE signal at an inverting input port and receives the STROBE signal at its other, non-inverting input port.

The output of the AND gate 16 is received at the set input port of an R-S flip-flop 18, which receives the complement of the STROBE signal at its reset input port. The result of this arrangement is that the R-S flip-flop 18 remains in its reset condition so long as the STROBE signal is low, but it is set if the INRANGE signal is low at any time at which the STROBE signal is high. When the R-S flip-flop 18 is in its set state, it remains in that state until the STROBE signal goes low again and resets it. The output of the R-S flip-flop 18 is high at the end of any high period of the STROBE signal during which the INRANGE signal has at some time been low—i.e., at the end of any such period during some part of which the SENSE signal was outside of the expected range.

The STROBE signal is also fed to one of the input ports of an OR gate 20, which sends its output to the gate input port of a transparent latch 22. A high value of the STROBE signal causes a high output of the OR gate 20, and this output causes the transparent latch 22 to be *transparent*—i.e., to forward the output of the R-S flip-flop as the ERROR signal. Thus, when an out-of-range SENSE signal occurs during a time interval defined by the STROBE signal, the transparent latch 22 forwards the resulting high output of the R-S flip-flop 18 as a high ERROR signal. Then, on the trailing edge of the STROBE signal, which resets the R-S flip-flop, the gate input to the transparent latch 22 goes low to capture the value that the output of the R-S flip-flop 18 had just prior to the end of the STROBE signal. The transparent latch 22 therefore keeps the ERROR signal high, retaining information indicating that an error occurred during the defined interval.

When the system has read the output of the transparent latch 22, it sends a momentary high FLUSH signal to the OR gate 20, thereby making the transparent latch momentarily transparent to cause it to forward and latch the now-low output of the R-S flip-flop 18 and thus cause the ERROR signal to go low again.

As described thus far, the error-detection circuit 10 operates in a relatively conventional manner. The circuit differs from conventional circuits of this type, however, in that the levels of the comparison-circuitry output are shifted up or down from the levels that would ordinarily be encountered, and this causes the circuitry to respond more quickly in certain circumstances.

Suppose that the SENSE signal passes into the range indicated by the XPRANGE signals. Just before the SENSE signal passes into this range, the INRANGE signal is low, indicating that the SENSE signal is not in range. When the SENSE signal does pass into range, the INRANGE signal begins to move toward its high value, but the transition is not instantaneous, and there is accordingly a delay between the transition of the SENSE signal and the time at which the INRANGE signal reaches its high value. This delay affects the time at which the STROBE signal can be sent. Specifically, to determine whether an expected value has begun by time $t_0$, the STROBE signal must not go high until a time $t_0 + T_{PD}$, where $T_{PD}$ is the delay between the time at which the SENSE voltage signal first passes into the expected range and the time at which the resultant comparator output passes through the input threshold of the AND gate 16.

If the delay is known, accommodation in STROBE timing can be made, so the delay does not, in principle, have to detract from measurement accuracy. As a practical matter, however, the delay is affected by the amplitude of the sense signal; a greater overvoltage causes a faster change in the INRANGE signal and thus a shorter delay. This delay variation causes measurement inaccuracy. Furthermore, a greater delay for a given overvoltage generally results in a greater delay variation for a given overvoltage variation and thus greater inaccuracy.

It is therefore desirable for the delay to be as short as possible. According to the present invention, this result is achieved—without using faster comparators in the comparison circuit—by changing the output levels of the comparison circuitry so that one or the other of its levels is closer to the input threshold of the AND gate 16. (As will become apparent in light of the description that follows, what is described as changing the comparison-circuitry output levels can just as well be thought of as changing the input threshold of the AND gate 16 to bring it closer to one or the other of the comparison-circuit output levels.) The result of this change can be appreciated by reference to FIG. 2, which is a timing diagram showing the relationships between the various signals and the circuitry of FIG. 1.

Figure 2:
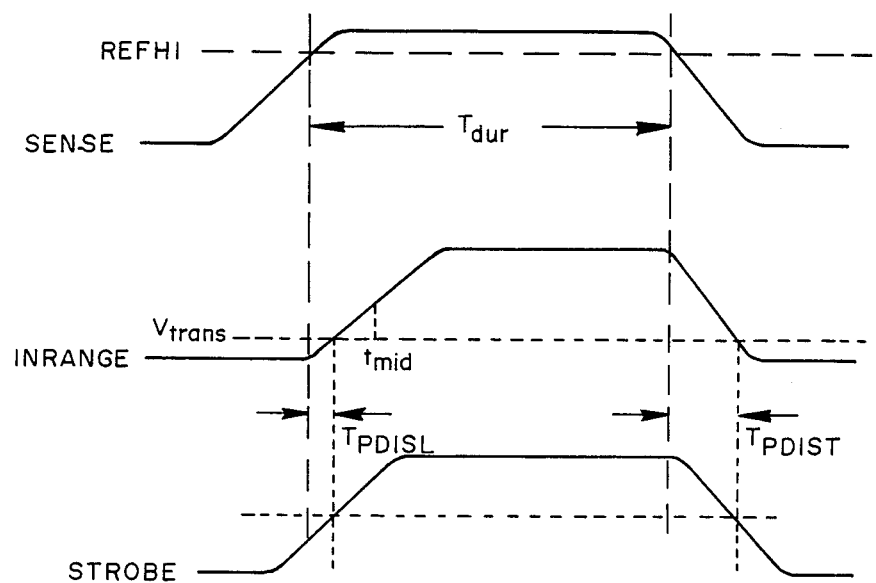
FIG. 2 is a timing diagram depicting the various signals in the circuit of FIG. 1.

The top signal depicted in FIG. 2 is the SENSE signal. To pass the test, the SENSE signal must exceed the upper reference level REFHI by time $t_0$ and remain above that level at least until $t_0 + T_{dur}$.

The second signal depicted in FIG. 2 is the IN-RANGE signal, which is shown as beginning to rise at $t_0$, when the SENSE signal crosses the upper reference level REFHI. In a more conventional arrangement, the comparator output would not be interpreted as indicating that the SENSE signal had crossed REFHI until approximately time $t_{mid}$, the time at which the comparator output reaches the midpoint between its two predetermined output levels. According to the present invention, however, the voltage $V_{trans}$ at which the transition between comparator output levels is recognized has been adjusted downward toward the lower comparator output level so that the delay between the SENSE-signal transition and the time at which that transition is recognized is only $T_{PDISL}$. Consequently, the time at which the STROBE signal should make its transition is only $t_0 + T_{PDISL}$, not $t_{mid}$. In short, the response time of the circuit is greatly decreased.

Figure 3:
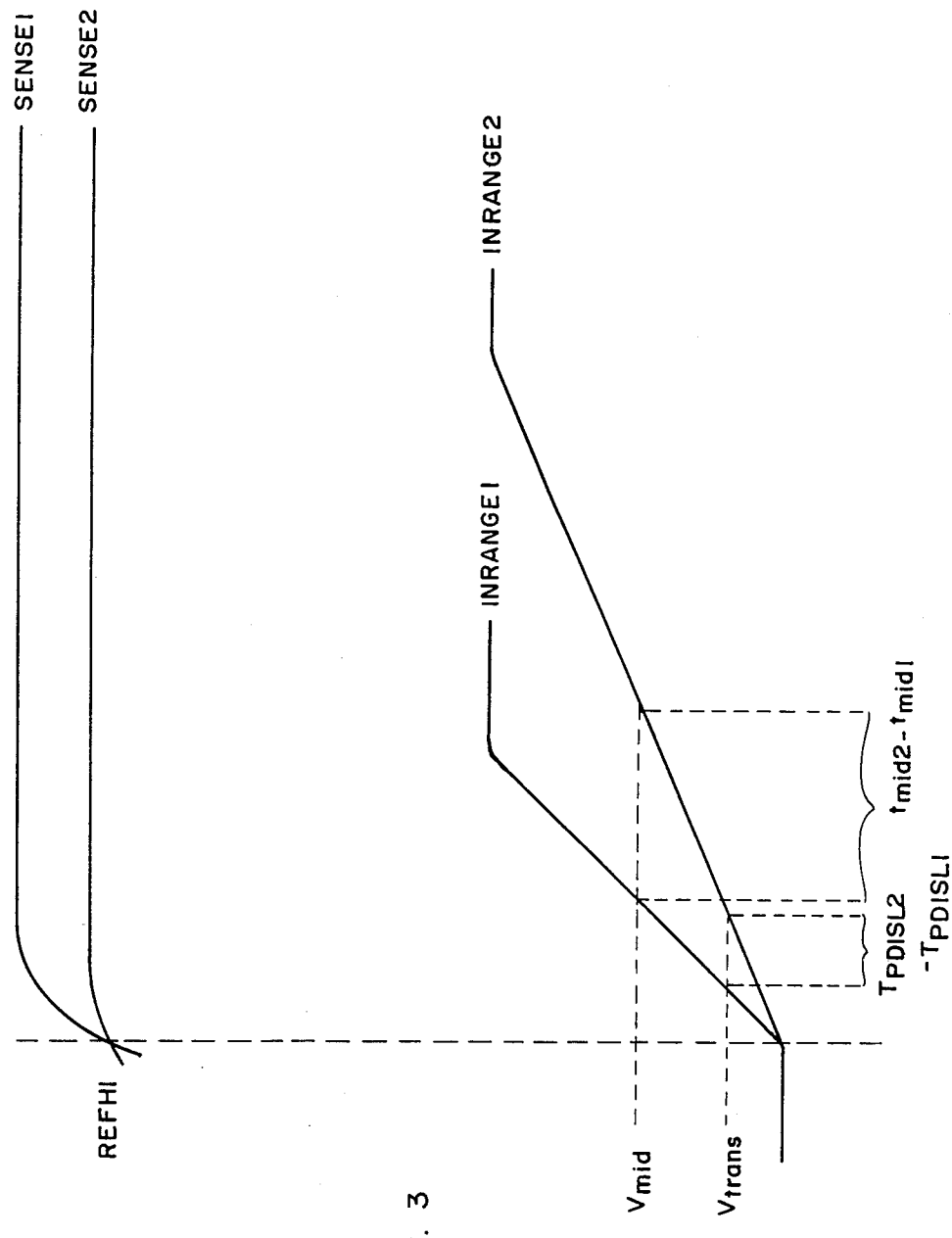
FIG. 3 is a timing diagram depicting the differences between the effects of signals of different amplitudes.

The result is that accuracy is also increased, as FIG. 3 illustrates. FIG. 3 is an exaggerated representation of the results of two different SENSE signals, SENSE1 and SENSE2. Both of these signals reach REFHI at the same time, but SENSE1 has a greater overvoltage. Because of its greater overvoltage, SENSE1 causes an INRANGE signal, INRANGE1, that rises faster than INRANGE2, which is the result of SENSE2. If the voltage at which the transition between comparator levels is recognized were $V_{mid}$, the delay variation would be the relatively large quantity $t_{mid2} - t_{mid1}$. Since the transition voltage is $V_{trans}$, however, the delay variation is the relatively small quantity $t_{PPISL2} - t_{PPISL1}$.

Not only is the level at which a comparator-output transition is recognized offset from the midpoint, but it is also adjustable in accordance with a signal THADJ (threshold adjust) sent to the comparison circuitry 12 of FIG. 1. The reason for this can be appreciated by further reference to FIG. 2, in which the transition voltage $V_{trans}$ is not adjusted. At time $t_0 + T_{dur}$, the SENSE signal falls below REFHI; that is, it falls outside the prescribed range exactly at the end of the prescribed duration. When SENSE does fall below REFHI, the INRANGE signal starts downward but takes a relatively long time $T_{PDIST}$ to reach the transition voltage $V_{trans}$. As a consequence, in order to insure that SENSE has been above REFHI throughout the period $t_0 + T_{dur}$, the STROBE signal must not be allowed to fall below its transition level until $t_0 + T_{dur} + T_{PDIST}$. Accordingly, the advantage gained at the leading edge is lost at the trailing edge.

To avoid this result, the circuit is arranged so that $V_{trans}$ is adjustable from the level close to the low level of INRANGE indicated in FIG. 2 to a level that is a corresponding voltage from its high level.

Figure 4:
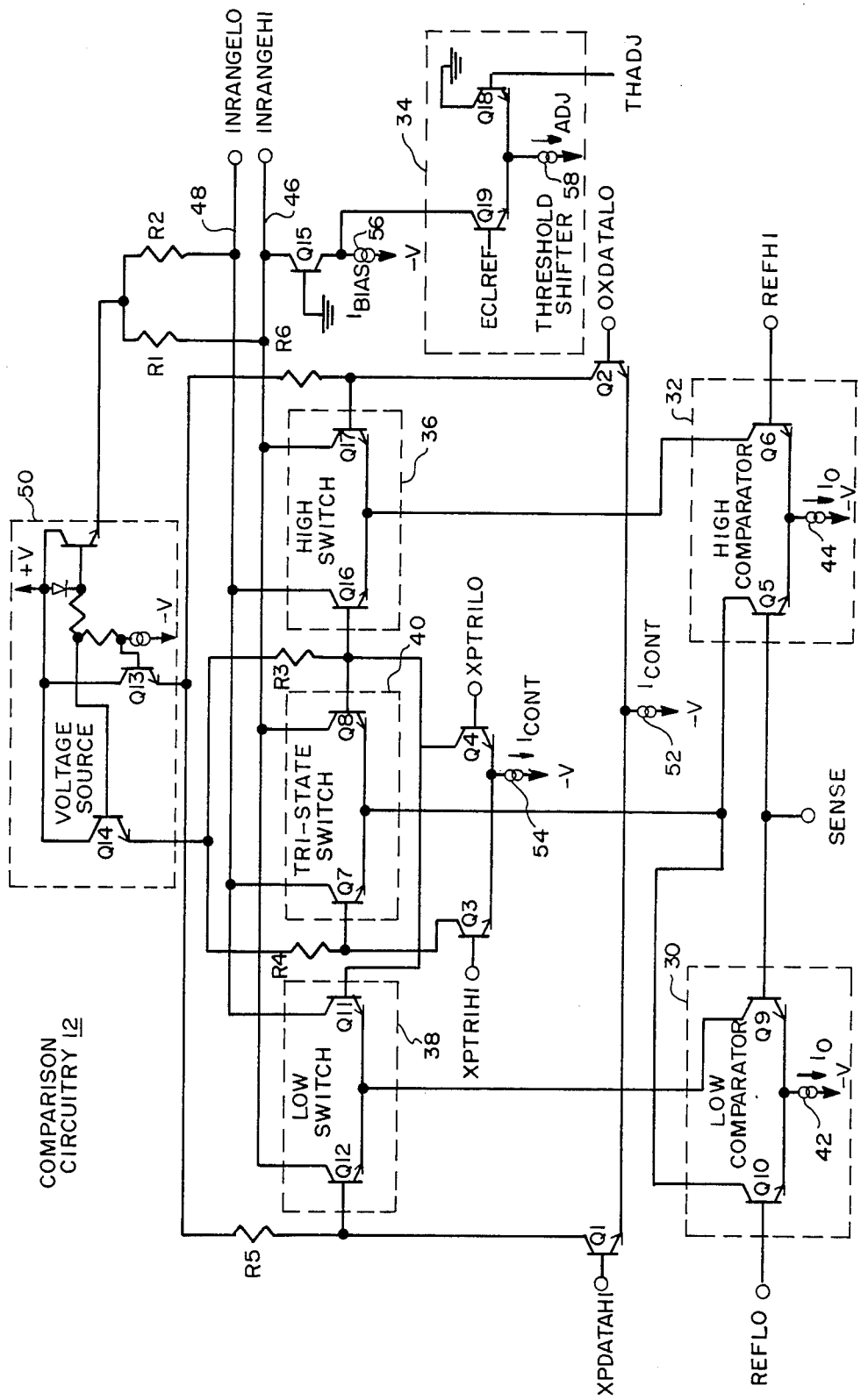
FIG. 4 is a schematic diagram showing the comparator, switch, and threshold-adjust circuitry in greater detail.

FIG. 4 depicts in more detail the comparison circuitry 12 of FIG. 1. In the description of the circuitry of FIG. 4 that follows, many of the signals in the circuit are shown as differential signals, the quantity of interest being the difference between the voltages on two signal lines. Of course, the present invention can also be practiced in arrangements in which the signals are carried by single signal lines, that is, by a circuit in which all the signals are referenced to a single ground level.

The specific design shown in that drawing lends itself particularly to implementation in a relatively inexpensive semi-custom chip of the type in which an off-the-shelf basic chip design is adapted by a userspecified interconnection layer. The arrangement depicted in FIG. 4 is one adapted for use with a basic chip of the type designated MOR by the Interdesign Corporation. By employing the teachings of the present invention, a fast-response circuit can be realized in a semi-custom circuit of this type rather than in one employing more-expensive high-speed comparators.

The SENSE signal introduced at the bottom of FIG. 4 is sent to one input port of each of two comparators 30 and 32. Comparator 30 receives as its other input a low reference voltage REFLO, which represents the upper boundary of the low-voltage range for which the unit under test is to be tested; if the expected voltage is a low voltage, the unit under test will be found to have met the test if the SENSE signal is below REFLO. Similarly, the high comparator 32 receives REFHI, which represents the low boundary of the high range. A node under test that is expected to be high will pass the test if its voltage is above REFHI The rest of the circuitry of FIG. 4 employs the outputs of the comparators 30 and 32 to generate an indication of whether the SENSE signal is within the expected range. This indication is represented by the potential difference between the INRANGEHI and INRANGELO signals. The INRANGEHI and INRANGELO signals are collectively represented in FIG. 1 by the single INRANGE line. The expected range is indicated by the XPRANGE signal of FIG. 1, as was explained above, and the XPRANGE signals are shown in FIG. 4 as the signals designated XPDATALO, XPDATAHI, XPTRIHI, and XPTRILO.

When the XPTRIHI signal is higher than the XPTRILO signal, the voltage level of the SENSE signal is expected to be between the REFHI and REFLO levels, and INRANGEHI will be at a higher level than INRANGELO if SENSE is between REFHI and REFLO. If the SENSE signal is higher than REFHI or lower than REFLO, on the other hand, INRANGELO will be higher than INRANGEHI, indicating that the SENSE signal is not within the expected range.

When XPTRILO is higher than XPTRIHI, the expected level is indicated by the relative voltages of XPDATALO and XPDATAHI. If XPDATAHI is higher than XPDATALO, the SENSE voltage is expected to be above REFHI. If XPDATALO is higher than XPDATAHI, SENSE is expected to be lower than REFLO. Again, the relative levels of INRANGEHI and INRANGELO indicate whether the SENSE signal is actually within the range indicated by XPDATAHI and XPDATALO.

As was stated previously, the relative values of INRANGEHI and INRANGELO are represented in FIG. 1 by the single INRANGE line. The circuitry of FIG. 1 interprets INRANGE as being at a high level if INRANGEHI is higher than INRANGELO and interprets it as being at a low level if INRANGELO is lower than INRANGEHI. In other words, $V_{trans}$ in FIG. 2 is the point at which INRANGEHI equals INRANGELO. To "move" the $V_{trans}$ level toward one or the other end of the range of INRANGE, the range of the relative voltages of INRANGELO and INRANGEHI are adjusted by means of a threshold adjuster 34. In order to understand how the threshold adjuster works, however, it is necessary first to consider the operation of the rest of the comparison circuitry of FIG. 4.

The comparison circuitry 12 of FIG. 4 operates by the interaction of the high and low comparators 32 and 30 with high and low switches 36 and 38 and a tri-state switch 40. The high and low switches in turn are controlled by transistors Q1 and Q2, which receive at their bases the XPDATAHI and XPDATALO signals, respectively. Further transistors Q3 and Q4, which receive at their bases the XPTRIHI and XPTRILO signals, respectively, control the tri-state switch 40 and also contribute to the control of the high and low switches 36 and 38. The switches 36, 38, and 40 serve to divide the currents drawn by current sinks 42 and 44 between load resistors R1 and R2, through which the INRANGEHI and INRANGELO lines 46 and 48 are connected to one of the output ports of a voltage source 50. Together with the action of the threshold adjuster 34, the manner in which the total current drawn by current sinks 42 and 44 is divided between the INRANGEHI and INRANGELO lines 46 and 48 determines the relative voltages of those signals.

To describe the manner in which the current is divided, we first consider the situation in which the expected signal is a high signal; that is, the SENSE signal is expected to be higher than REFHI and therefore higher than REFLO. To indicate that SENSE should be high, XPDATAHI is higher than XPDATALO, and XPTRILO is higher than XPTRIHI. If the SENSE signal does assume its expected value—i.e., if SENSE is higher than REFHI—then the current drawn by current sink 44 flows through the left high-comparator transistor Q5 rather than through the right high-comparator transistor Q6, so it is drawn through the tri-state switch 40 rather than through the high switch 36. Furthermore, the current flowing through the tri-switch 40 flows through the left transistor Q7 rather than through the right transistor Q8 and is thus drawn along the INRANGELO line 48 through R2 rather than along the INTRANGEHI line 46 through R1. Transistor Q7 conducts because the XPTRILO signal at the base of Q4 is higher than the XPTRIHI signal at the base of Q3, and Q3 and Q4 have their emitters connected in a differential arrangement to a common current sink 54. The result is that the control current $I_{cont}$ drawn by current sink 54 is drawn through a load resistor R3, rather than through another load resistor R4, from one of the output ports of the voltage source 50 and thus causes the base voltage of Q7 to be higher than that of Q8.

In short, the entire current $I_0$ drawn by current sink 44 is drawn through R2 and thus tends to draw the voltage of the INRANGELO line 48 low. At the same time, the current drawn by the low-comparator current sink 42 flows through the right low-comparator transistor Q9 rather than through the left low-comparator transistor Q10 because the SENSE signal at the base of Q9 is higher than the REFLO signal at the base of Q10, and these transistors have their emitters connected in common to current sink 42. Accordingly, the current drawn by current sink 42 flows through the low switch 38 rather than through the tri-state switch 40. As will be explained below, the current flowing through low switch 38 flows through the right low-switch transistor Q11, not the left low-switch transistor Q12, so the current drawn by the low-comparator current sink 42 flows through R2 to further drop the voltage of the INRANGELO line 48.

The reason why the low-switch current flows through Q11 rather than Q12 is that the base circuit of Q11 is biased from a port of the voltage source 50 different from that from which the base circuit of Q12 is biased. Specifically, the base voltage of Q12 is set by a current that flows from the emitter of voltage-source transistor Q13 through a load resistor R5 to current sink 52. The entire current $I_{cont}$ drawn by current sink 52 flows through R5 and Q1 rather than through R6 and Q2 because XPDATAHI is higher than XPDATALO.

In contrast, the base of Q11, like the base of Q8 of the tri-state switch 40, has its voltage set by a current that flows from the emitter of voltage-source transistor Q14, through load resistor R3 and control transistor Q4 to current sink 54, which draws a current equal to that of current sink 52. Load resistors R3 and R5 are equal in resistance, so the drops in voltage across R3 and R5 are equal. However, the emitter voltage of voltage-source transistor Q14 is higher than the emitter voltage of voltage-source transistor Q13, so the base voltage of Q11 is higher than that of Q12. When XPDATAHI and XPTRILO are both high, therefore, the base voltage of Q11 is higher than the base voltage of Q12, so Q11 conducts and Q12 does not.

In short, when the XPTRIHI, XPTRILO, XPDATAHI, and XPDATALO signals indicate that the SENSE signal is expected to be above REFHI, all of the current drawn by current sinks 42 and 44 flows through load resistor R2 by way of the INRANGELO line 48, and this causes the INRANGELO voltage to be relatively low if SENSE is higher than REFHI. In this state, none of the current drawn by the current sinks 42 and 44 flows by way of the INRANGEHI line 46 through R1. This is a general result; when SENSE is in its expected range, all of the current drawn by current sinks 42 and 44 flows through R2.

However, some current is drawn through R1 through a level-setting transistor Q15 by a further current sink 56 and possibly by the threshold adjuster 34. If a THADJ signal applied to the threshold shifter 34 is higher than a reference level ECLREF, the threshold shifter 34 draws no current, and the current that flows through R1 is simply the current $I_{bias}$ drawn by a bias current sink 56. If THADJ is lower than ECLREF, the threshold adjuster draws the current $I_{adj}$ drawn by its current sink 58, so the current flowing through R1 equals $I_{bias}+I_{adj}$. Resistors R1 and R2 are equal in resistance, and the sum of $I_{bias}$ and $I_{adj}$ is less than twice $I_0$. Accordingly, when SENSE is within the expected range, INRANGEHI is higher than INRANGELO.

The result is different when SENSE is not within the expected range. For example, if SENSE is expected to be higher than REFHI but in fact is lower, the current drawn by current sink 44 flows through Q6 rather than through Q5 and thus is drawn from the high switch 36. Since XPDATALO is low and XPTRILO is high, current is drawn through R3 in the base circuit of high-switch transistor Q16 but not through another load resistor R6 in the bas circuit of the other high-switch transistor Q17. Consequently, current flows through the right high-switch transistor Q17 rather than through the left high-switch transistor Q16 and is thus drawn by way of the INRANGEHI line 46 through R1. Because the SENSE signal is lower than REFHI, therefore, the current drawn by the current sink 44 flows by way of the INRANGEHI line 46 rather than the INRANGELO line 48 as it does when SENSE is higher than REFHI.

The current drawn by the low-comparator current sink 42, on the other hand, still flows through the INRANGELO line 48. If the SENSE signal is lower than the REFHI voltage, it may be higher or lower than the REFLO voltage. Thus, the current drawn by current sink 42 may flow through the low switch 38 or through the tri-state switch 40. In both cases, since both the low switch 38 and the tri-state switch 40, as explained above, are set to draw current from the INRANGELO line 48, the current drawn by current sink 42 flows through R2 regardless of the value of SENSE signal.

Therefore, when the expected signal is high but SENSE is not in fact higher than REFHI, the current drawn by current 44 flows through load resistor R1, and the current drawn by current sink 42 flows through R2. The voltages on the INRANGEHI and INRANGELO lines 46 and 48 would thus be equal if it were not for the curren flowing through the voltage-setting transistor Q15. Since this transistor conducts either $I_{bias}$ or $I_{bias}+I_{adj}$ in accordance with the value of the THADJ signal, more current is drawn through R1 than is drawn through R2, so INRANGEHI is lower than INRANGELO when SENSE is expected to be high but is in fact lower than REFHI.

Through a similar analysis, it can be seen that all of the current drawn by current sinks 42 and 44 flows by way of the INRANGELO line 48 through R2 if SENSE is lower than REFLO when it is expected to be low, and this current is split between those two resistors if SENSE is higher than REFLO although it is expected to be low. Therefore, if the expected SENSE level is high or low, the comparator current all flows through R2 when SENSE is in the expected range and is split between R1 and R2 when it is not.

The same result obtains when the SENSE signal is expected to be at the tri-state level. When SENSE is expected to be at the tri-state level—i.e., when it is intended that SENSE be between REFLO and REFHI—XPTRIHI is higher than XPTRILO, and, as will become apparent, the relative voltages of XPDATAHI and XPDATALO do not matter. When XPTRIHI is higher than XPTRILO, the current drawn by current sink 54 flows through Q3 rather than Q4, being drawn from the emitter of voltage-source transistor Q14 through load resistor R4 to cause the base of Q7 to be lower than the base of Q8. Thus, whatever current the comparators draw through the tri-state switch flows by way of the INRANGEHI line 46 through resistor R1.

In contrast, the INRANGELO line 48 and resistor R2 carry whatever current flows through the high switch 36 or the low switch 38, regardless of the relative values of XPDATAHI and XPDATALO. The relative values of XPDATAHI and XPDATALO do not matter, because, with XPTRILO at a low level, the bases of high-switch transistor Q16 and low-switch transistor Q11 are both kept at the emitter voltage of voltage-source transistor Q14. This voltage is higher than the emitter voltage of voltage-source transistor Q13, which supplies the base circuits of high-switch transistor Q17 and low-switch transistor Q12. Therefore, high-switch transistor Q16 and low-switch transistor Q11 conduct whatever current flows through their respective switches, drawing it through R2 by way of the INRANGELO line 48 regardless of the values of XPDATAHI and XPDATALO.

If SENSE is between REFHI and REFLO, the high comparator 32 draws its current through the high switch 36, while the low comparator 30 draws its current through the low switch 38. If SENSE is not between REFHI and REFLO, on the other hand, one or the other of the comparators 30 and 32 draws its current through the tri-state switch 40 while the other draws its current through one or the the other of the high and low switches 36 and 38.

Accordingly, all of the current drawn by the current sinks 42 and 44 flows by way of the INRANGELO line 48 through R2 if the SENSE voltage is, as expected, between REFHI and REFLO. If, unexpectedly, SENSE is higher than REFHI or lower than REFLO, the current drawn by one of the current sinks 42 and 44 flows by way of the INRANGEHI line 46 through R1, and the current drawn by the other current sink flows by way of the INRANGELO line 48 through R2. Thus, INRANGEHI is higher than INRANGELO if SENSE is between REFHI and REFLO when the expected signal is at the tri-state level, and, because $I_{bias}$ or $I_{bias} + I_{adjust}$ flows through R1, INRANGELO is higher than INRANGEHI if SENSE is above REFHI or below REFLO.

It is now possible to describe the way in which the threshold of the INRANGE signal is adjusted to enable the circuit to respond more quickly than the speed of comparators 30 and 32 would otherwise make possible. So far, I have described situations in which the SENSE signal differs from REFHI and REFLO. I will now discuss what happens as SENSE passes through one of the reference voltages—for example, REFHI. At the point at which SENSE exactly equals REFHI, the base voltage of Q5 equals that of Q6, and the current drawn by current sink 44 would be divided between them if that equality lasted for very long. But this equality is only a very transient condition; the sensitivity of the comparator's differential configuration is such that only a very little difference in voltage between the base signals is needed to cause one or the other of the transistors to be completely dominant as the current path.

Although there is only an extremely short time during which the SENSE signal is at a level that would cause Q5 and Q6 to share the current-sink current in a static condition, the response of these transistors to the change from one state to another is not as fast as the change in the SENSE signal might suggest; although the SENSE signal changes very quickly from a level that in a static condition would cause all the current to flow through Q5 to a level that in a static condition would cause all of it to flow through Q6, the current flow is not passed from Q5 to Q6 that quickly, and this is the cause of the comparator delay. It is in this regime of operation, in which current flow is being passed from one transistor to the other, in which the threshold adjustment has its effect.

In conventional digital circuitry, the transition level for a comparator output—i.e., the boundary between what is interpreted as high and what is interpreted as low—occurs approximately halfway between the comparator's two stable output levels. Such a transition level would result when the input is equal to the reference in a conventional comparator. In the circuit of FIG. 4, this would mean that the current flowing through Q15 would be equal to $I_0$ if the circuit were operating in a conventional manner; when SENSE equals REFHI or REFLO so that one or the other of the comparators is dividing the current equally between its transistors, the switches draw $3I_0/2$ through the INRANGELO line 48 and $I_0/2$ through the INRANGEHI line 46, so equality in voltage between INRANGEHI and INRANGELO would dictate that Q15 conduct $I_0$ so that $3I_0/2$ is drawn through both R1 and R2.

According to the present invention, however, the current that flows through Q15 is either considerably less or considerably more than $I_0$. Specifically, current sink 56 draws less than $I_0/2$. As a result, when THADJ is higher than ECLREF and SENSE is expected to be high, INRANGEHI does not equal INRANGELO until Q6 conducts much more current than Q5. On the other hand, the current $I_{adj}$ drawn by current sink 58 of the threshold shifter 34 is high enough that $I_{adj} + I_{bias}$ is greater than $3I_0/2$. Therefore, if THADJ is lower than ECLREF and SENSE is expected to be high, the INRANGEHI and INRANGELO signals equal each other when high-comparator transistor Q6 draws even a quarter of the current drawn by the high-comparator current sink 44. Accordingly, by setting THADJ high or low in accordance with the current comparison-circuit output, equality between the INRANGEHI and INRANGELO signals can be caused to occur very soon after the comparator state *begins* to change from one state to the other.

Figure 5:
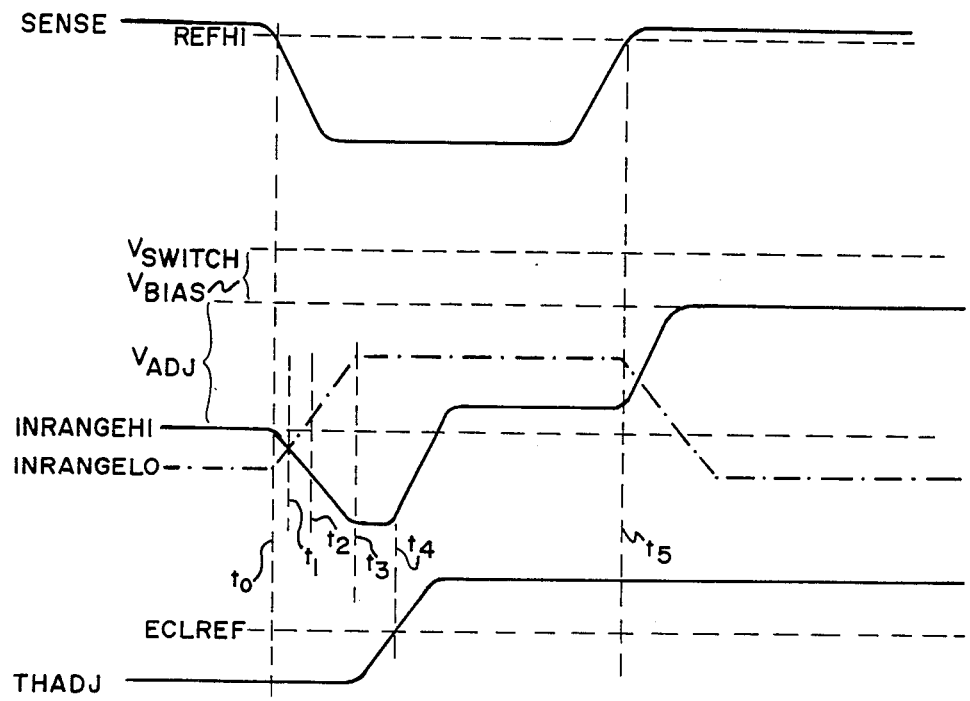
FIG. 5 is a timing diagram illustrating the operation of the threshold-adjust feature of the present invention.

FIG. 5 illustrates this behavior. In FIG. 5, there are three plots, one showing the SENSE signal, another showing INRANGEHI and INRANGELO, and a third showing THADJ. The INRANGEHI and INRANGELO signals are shown as beginning relatively close together, as they will if SENSE starts out greater than REFHI, XPDATAHI is greater than XPDATALO, indicating that a high signal is expected, and THADJ is less than ECLREF so that the higher level of current is flowing through transistor Q15. With no current flowing through Q15, the INRANGEHI signal would be at the level designated in FIG. 5 as $V_{switch}$. If THADJ were higher than ECLREF, so that the current drawn by the current sink 58 in the threshold shifter 34 were not drawn through Q15, then INRANGEHI would be lower than $V_{switch}$ only by an amount designated in FIG. 5 as $V_{bias}$. However, with THADJ lower than ECLREF, the additional current drawn by current sink 58 drops the INRANGEHI signal by an additional $V_{adj}$ to result in the INRANGEHI level indicated at the left of FIG. 5.

The INRANGEHI and INRANGELO signals maintain the levels shown at the left in FIG. 5 until the SENSE signal falls below the REFHI signal at $t_0$. When SENSE falls below REFHI, as was mentioned above, the transitions of the comparator transistors Q5 and Q6 are not instantaneous. Accordingly, INRANGEHI and INRANGELO change gradually, INRANGEHI going lower throughout a period from $t_0$ to $t_3$ in FIG. 5, while INRANGELO goes from its relatively low level to its higher level during the same period. In a conventional comparator circuit having transistors of the same speed as those in the embodiment of FIG. 4, the transition in the meaning of the output of circuit 12—i.e., the point at which INRANGEHI and INRANGELO become equal—would occur at $t_2$, which is halfway between the time at which the signals begin their transition and the time at which the transition is completed. According to the present invention, however, the current drawn through Q15 causes the INRANGEHI and INRANGELO signals to start relatively close to each other, so the transition actually occurs at $t_1$. There is thus a much smaller delay between the time at which the SENSE signal crosses the reference level and the time at which the comparison circuit 12 indicates this fact.

At time $t_3$ the INRANGEHI and INRANGELO signals are relatively far apart, and a change in the SENSE signal would result in a significantly larger delay if there were no change in the threshold shifter 34. But the threshold shifter is adjustable by a change in the value of the THADJ signal. As FIG. 5 indicates, THADJ goes from below the ECLREF level to above the ECLREF level at $t_4$. As a result, the INRANGEHI signal increases in value by $V_{adj}$ so that it again becomes close to the INRANGELO level. Thus, when the SENSE signal again increases above the REFHI level at $t_5$, the INRANGEHI and INRANGELO signals are close together, so the circuit of FIG. 4 again responds quickly to a transition in the SENSE signal.

Figure 6:
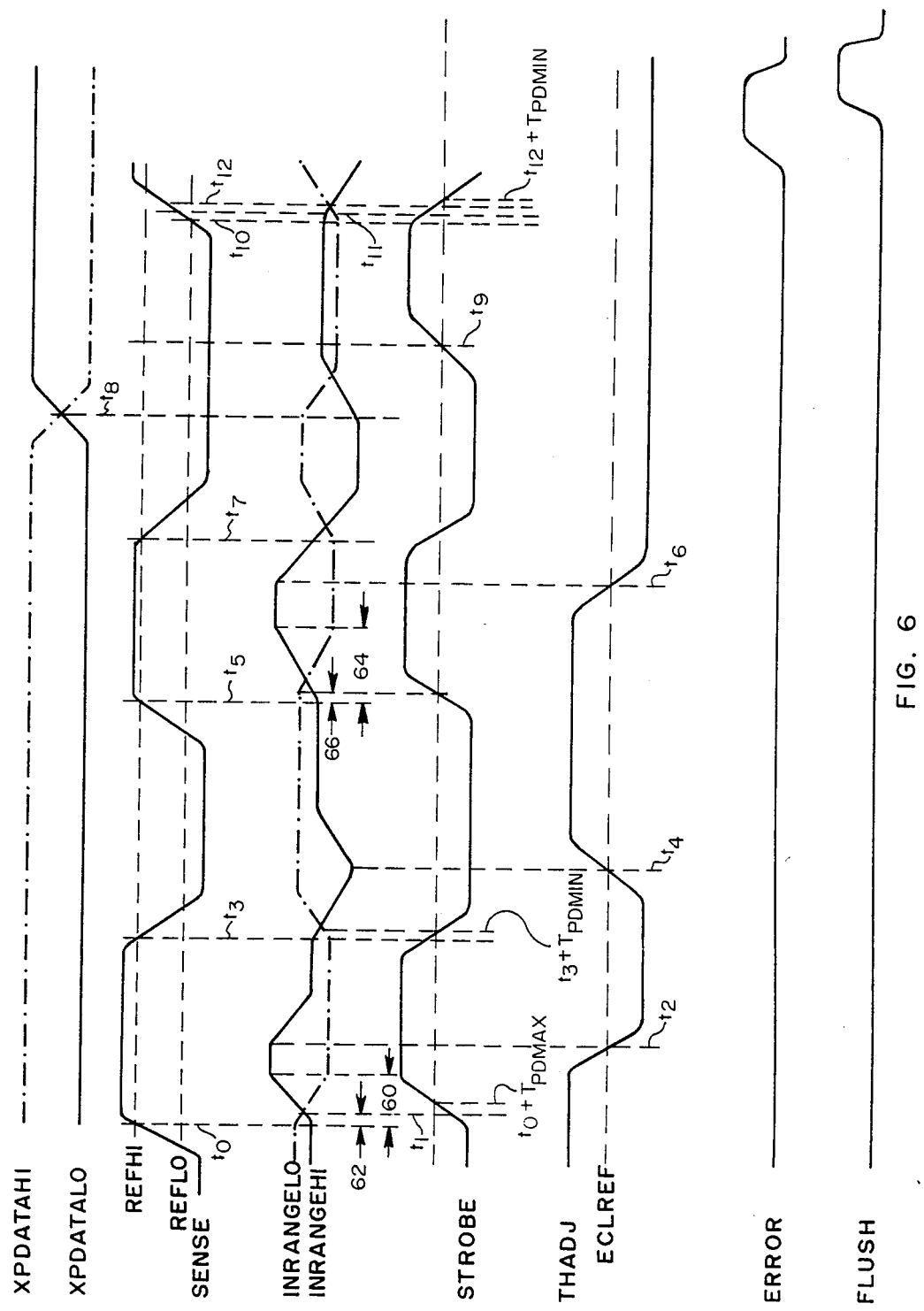
FIG. 6 is a timing diagram showing a sequence of signal transitions that illustrates the operation of the illustrated embodiment of the present invention.

FIG. 6 depicts a number of signals that demonstrate the response of the circuit of FIG. 1 to various inputs. In FIG. 6, XPDATAHI starts out at a level higher than that of the XPDATLO. This indicates that a high SENSE signal is expected. (It will be assumed throughout the discussion of FIG. 6 that the XPTRIHI and XPTRILO signals indicate that the high-impedance state is not expected.)

In FIG. 6, the tester initially tests for a high signal that must be present by time $t_0$. FIG. 6 shows that the SENSE signal crosses REFHI at just the required time, so the tester should conclude that an error has not occurred. In response to the transition of the SENSE signal, the INRANGEHI signal becomes more positive and INRANGELO becomes less positive. The time required to complete the transition is the relatively long time period indicated by arrows 60. However, the actual delay between the transition of SENSE and the time at which an indication of the transition reaches the sampling circuitry 14 is the small fraction of time period 60 represented by arrows 62. Since it is intended that the SENSE signal reach its level by time $t_0$, a STROBE signal is generated at time $t_0+T_{pDMAX}$, which is the maximum expected delay of the comparison circuitry 12. In this case, there is a significant overdrive signal—i.e., the SENSE signal is considerably higher than REFHI—so the INRANGELO and INRANGEHI signals have changed levels rapidly, causing them to cross at time $t_1$, before the transition of the STROBE signal. Consequently, no error is detected, so the ERROR signal stays low.

Since the SENSE signal has gone high, the INRANGEHI and INRANGELO signals both continue to change until they reach values that differ considerably from each other. If SENSE were to fall below REFHI while the INRANGEHI and INRANGELO signals differed by that much, there would be a relatively long period of time before INRANGEHI reached INRANGELO, so there would be a long delay between the change in the SENSE signal and a resulting change in the output of the comparison circuitry 12.

In order to avoid this result, the THADJ signal is brought to a level below ECLREF at time $t_2$, causing threshold-shifter transistors Q18 and Q19 to turn off and on, respectively, so INRANGEHI drops to a level close to that of INRANGELO. Accordingly, when SENSE falls below REFHI at time $t_3$, the time required for INRANGEHI and INRANGELO to cross each other is a relatively low fraction of the time required for those signals to reach their new levels. SENSE is expected to be high at least until time $t_3$, so the STROBE signal is caused to make its transition at $t_3+T_{pDMIN}$, where $T_{pDMIN}$ is the minimum expected delay of the comparison circuitry. Since INRANGEHI and INRANGELO do not cross until that time, no error is detected, and the ERROR signal remains low.

THADJ makes another transition at time $t_4$, so the INRANGEHI and INRANGELO signals are again brought close together before the next transition of SENSE, which occurs at time $t_5$. In this instance, the SENSE signal only barely exceeds the REFHI level—i.e., there is very little overdrive of the high comparator 32. Therefore, the time, designated by arrows 64, for the INRANGEHI and INRANGELO signals to reach their new levels is longer than the time 60 required for those signals to reach their new levels during the previous high state of the SENSE signal. If it were necessary for the STROBE transition to follow the SENSE transition by half the time required for the INRANGEHI and INRANGELO signals to reach their new levels, as would be required in conventional comparison circuitry, then the test-circuitry timing would have to accommodate a greater variation in comparison-circuit delay than it does when the circuity of the present invention is employed Although there is a significant variation between the times represented by arrows 60 and 64, only the variation between the times represented by arrows 62 and 66 must be accommodated, and this is a small fraction of the variation of the times represented by arrows 60 and 64.

At time $t_6$ the THADJ signal again falls below ECLREF to cause the INRANGEHI and INRANGELO signals to come close together again. The SENSE signal then falls below REFHI at time $t_7$, and the INRANGEHI and INRANGELO signals promptly cross each other and become separated by a relatively high voltage.

During all the time described so far, the tester has been examining the SENSE signal for required periods of a high level. The tester now looks for a low level, so it causes the XPDATAHI and XPDATALO signals to change levels at time $t_8$. In response, the high and low switches 36 and 38 are operated to redirect the currents conducted by the high and low comparators 32 and 30, and the INRANGEHI and INRANGELO signals accordingly change levels, as the drawing indicates. Therefore, when the STROBE signal crosses its threshold at time $t_9$, INRANGEHI and INRANGELO indicate that the SENSE signal is at the required level, and there is initially no indication of an error. But the low level is intended to remain at least until time $t_{12}$, so the STROBE signal is timed to pass throuh its threshold at time $t_{12} + T_{PDMIN}$ In contrast, the SENSE signal passes above the REFLO level at time $t_{10}$, which occurs before $t_{12}$. As a result, the INRANGELO and INRANGEHI signals pass each other at time $t_{11}$, which occurs before $t_{12} + T_{PDMIN}$, the time at which the STROBE signal makes its transition. Accordingly, an error is detected, and the ERROR signal goes high after a short delay.

After the tester has read the ERROR output of latch 22, it sends a FLUSH pulse, thereby rendering the transparent latch 22 momentarily transparent. As a result, the output of R-S flip-flop 18, which has been reset by the STROBE signal, passes through the transparent latch 22 so that the error signal again goes low. When the FLUSH signal is removed, the low level remains because the transparent latch 22 returns to its latched state.

As is apparent in light of the foregoing description, the teachings of the present invention can provide greater responsiveness and repeatability in comparison circuitry without using inherently faster component comparators. As a result, in automatic test equipment for large high-speed digital circuitry, and in other systems that require a large number of comparison circuits, significant reduction in cost can be obtained without sacrificing speed or repeatability.

What is claimed as new and desired to be secured by Letters Patent of the United States is:

1. An error-detection circuit comprising:
    A. an error indicator adapted for application thereto of a binary in-range signal and operable to generate an error indication if the in-range signal is on one side of a transition level;
    B. a comparison circuit, adapted for reception of an analog sense signal, for generating and applying to the error indicator the in-range signal, whose value changes by a predetermined voltage swing from one to the other of first and second voltage levels through the transition level when the sense signal passes into or out of a predetermined range, one of the first and second voltage levels differing from the transition level by less than one-quarter of the voltage swing, whereby the time required for the error-detection circuit to react to passage of the sense signal through a boundary of predetermined range in one direction is less than the time that would be required if the first and second voltage levels were nearly equidistant from the transition level.

2. An error-detection circuit as defined in claim 1 wherein:
    A. an in-range signal on one side of the transition level indicates that the sense signal is within the predetermined range, and an in-range signal on the other side of the transition level indicates that the sense signal is outside the predetermined range; and
    B. the error indicator is operable by application of a strobe signal thereto to generate the error indication if the in-range signal is on the other side of the transition level during the presence of the strobe signal but not if it is on the other side of the transition level only in the absence of the strobe signal.

3. An error-detection circuit comprising:
    A. an error indicator adapted for application thereto of an in-range signal and operable to generate an error indication if the in-range signal is on one side of a transition level;
    B. a comparison circuit, adapted for reception of an analog sense signal, for generating and applying to the error indicator the in-range signal, whose value changes by a predetermined voltage swing from one to the other of first and second voltage levels through the transition level when the sense signal passes into or out of a predetermined range, the comparison circuit being operable by application of a threshold-adjust signal thereto to shift the first and second voltage levels in the same direction to move one of the first and second voltage levels closer to the transition level.

4. An error-detection circuit as defined in claim 3 wherein
    A. the in-range signal changes by a predetermined voltage swing from one to the other of the first and second voltage levels when the sense signal passes into or out of the predetermined range; and
    B. the comparison circuit assumes one of first and second states in accordance with the value of the threshold-adjust signal, the first voltage level differing from the transition level by less than one-quarter of the voltage swing when the comparison circuit is in the first state, and the second voltage level differing from the transition level by less than one-quarter of the voltage swing when the comparison circuit is in the second state.

5. An error-detection circuit as defined in claim 4 wherein:
    A. an inrange signal on one side of the transition level indicates that the sense signal is within the predetermined range and an in-range signal on the other side of the transition level indicates that the sense signal is outside the predetermined range; and
    B. the error indicator is operable by application of a strobe signal thereto to generate the error indication if the in-range signal is on the other side of the transition level during the presence of the strobe signal but not if it is on the other side of the transition level only in the absence of the strobe signal.

6. an error-detection circuit as defined in claim 3 wherein:
    A. an in-range signal on one side of the transition level indicates that the sense signal is within the predetermined range and in-range signal on the other side of the transition level indicates that the sense signal is outside the predetermined range; and
    B. the error indicator is operable by application of a strobe signal thereto to generate the error indication if the in-range signal is on the other side of the transition level during the presence of the strobe signal but not if it is on the other side of the transition level only in the absence of the strobe signal.

* * * * *